(12) United States Patent
Fan

(10) Patent No.: US 12,250,832 B2
(45) Date of Patent: Mar. 11, 2025

(54) SEMICONDUCTOR MEMORY STRUCTURE HAVING DRAIN STRESSOR, SOURCE STRESSOR AND BURIED GATE AND METHOD OF MANUFACTURING THE SAME

(71) Applicant: NANYA TECHNOLOGY CORPORATION, New Taipei (TW)

(72) Inventor: Cheng-Hsiang Fan, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/383,570

(22) Filed: Oct. 25, 2023

(65) Prior Publication Data

US 2024/0055520 A1   Feb. 15, 2024

Related U.S. Application Data

(60) Division of application No. 18/226,374, filed on Jul. 26, 2023, which is a continuation-in-part of application No. 17/497,687, filed on Oct. 8, 2021, now Pat. No. 11,757,038, which is a division of application No. 16/520,569, filed on Jul. 24, 2019, now Pat. No. 11,211,491.

(51) Int. Cl.
| | | |
|---|---|---|
| *H10D 30/69* | (2025.01) | |
| *G11C 5/06* | (2006.01) | |
| *H01L 21/02* | (2006.01) | |
| *H01L 21/762* | (2006.01) | |
| *H10D 30/01* | (2025.01) | |

(52) U.S. Cl.
CPC ........... *H10D 30/797* (2025.01); *G11C 5/063* (2013.01); *H01L 21/02381* (2013.01); *H01L 21/76224* (2013.01); *H10D 30/021* (2025.01)

(58) Field of Classification Search
CPC .......... H01L 29/7848; H01L 29/66522; H01L 21/76224; H01L 29/42356; G11C 5/063
See application file for complete search history.

(56) References Cited

U.S. PATENT DOCUMENTS

| | | | |
|---|---|---|---|
| 10,043,854 B1 | 8/2018 | Shin | |
| 2004/0206998 A1* | 10/2004 | Anma | ............... H01L 28/91 257/306 |
| 2009/0114989 A1* | 5/2009 | Hamamoto | ............ H10B 12/20 257/E21.409 |

(Continued)

FOREIGN PATENT DOCUMENTS

| | | |
|---|---|---|
| CN | 104299971 A | 1/2015 |
| CN | 104798200 A | 7/2015 |

(Continued)

OTHER PUBLICATIONS

Office Action and and the search report mailed on Dec. 21, 2023 related to Chinese Application No. 202010434995.8.

*Primary Examiner* — Suberr L Chi
(74) *Attorney, Agent, or Firm* — Xuan Zhang

(57) ABSTRACT

The present disclosure provides a semiconductor memory structure, including a substrate, a gate structure, a first shallow trench isolation (STI), and a second STI. The gate structure, the first STI, and a second STI are disposed in the substrate. The gate structure is buried in the substrate. The gate structure is disposed between the first STI and the second STI.

9 Claims, 15 Drawing Sheets

(56) References Cited

U.S. PATENT DOCUMENTS

| | | | |
|---|---|---|---|
| 2012/0112271 | A1 | 5/2012 | Manabe |
| 2019/0115470 | A1* | 4/2019 | Sung ................. H01L 21/02532 |
| 2020/0044039 | A1* | 2/2020 | Liu ................... H01L 29/66772 |
| 2023/0369488 | A1* | 11/2023 | Fan ..................... H01L 29/0847 |

FOREIGN PATENT DOCUMENTS

| | | |
|---|---|---|
| CN | 105810736 A | 7/2016 |
| CN | 106098558 A | 11/2016 |
| CN | 106463512 A | 2/2017 |
| CN | 109285835 A | 1/2019 |
| CN | 109524399 A | 3/2019 |
| JP | 2011166163 A | 8/2011 |

* cited by examiner

SEMICONDUCTOR MEMORY STRUCTURE HAVING DRAIN STRESSOR, SOURCE STRESSOR AND BURIED GATE AND METHOD OF MANUFACTURING THE SAME

CROSS-REFERENCE TO RELATED APPLICATION

This application is a divisional application of U.S. Non-Provisional application Ser. No. 18/226,374 filed Jul. 26, 2023, which is a continuation-in-part application of U.S. Non-Provisional application Ser. No. 17/497,687 filed Oct. 8, 2021, which is a divisional application of U.S. Non-Provisional application Ser. No. 16/520,569 filed Jul. 24, 2019. Those are incorporated herein by reference in their entireties.

TECHNICAL FIELD

The present disclosure relates to a semiconductor memory structure and a method for manufacturing the same, and more particularly, to a semiconductor memory structure with a drain stressor, a source stressor and a buried gate and a method for manufacturing the same.

DISCUSSION OF THE BACKGROUND

Reducing the size of semiconductor devices results in improved performance, increased capacity, and/or reduced cost. As semiconductor devices become smaller in size, however, a semiconductor device may not be able to realize diverse device characteristics. Therefore, size reduction requires more sophisticated techniques for semiconductor device manufacturing. For example, when scaling the channel length of a metal-oxide-semiconductor field-effect transistor (MOSFET) to a certain extent, short channel effect might occur. A MOSFET device is considered to be short when the channel length is of the same order of magnitude as the depletion-layer widths of the source and drain junction. Short channel effects include, for example, drain-induced barrier lowering and hot carrier degradation.

Moreover, to enhance the performance of the semiconductor devices, strained silicon has been used. Strained silicon is a layer of silicon in which the silicon atoms are stretched beyond their normal interatomic distance. Moving these silicon atoms farther apart reduces the atomic forces that interfere with the movement of electrons through the transistors and thus improves carrier mobility, resulting in better chip performance and lower energy consumption. This can be accomplished by putting the layer of silicon over a substrate of, for example, silicon germanium (SiGe), in which the atoms are arranged farther apart than those of a silicon substrate.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

To address the problems previously described, one aspect of the present disclosure provides a semiconductor memory structure, including a substrate, a gate structure, a first shallow trench isolation (STI), and a second STI. The gate structure, the first STI, and a second STI are disposed in the substrate. The gate structure is buried in the substrate. The gate structure is disposed between the first STI and the second STI.

Another aspect of the present disclosure provides a method of manufacturing a semiconductor memory structure. The method includes: providing a substrate; forming a gate trench in the substrate; forming a gate structure in the gate trench, wherein the gate structure is buried in the substrate; and forming a STI and a second STI in the substrate. The gate structure is disposed between the first STI and the second STI.

The semiconductor memory structure disclosed in the present disclosure includes a gate structure disposed in a gate trench; that is, the gate is buried in the substrate. The buried gate is completely buried under the surface of the substrate, so that the length of the channel is ensured by carefully designed gate trench dimensions, and the short channel effects can therefore be avoided, which results in a semiconductor device with higher reliability.

Moreover, the drain stressor and the source stressor are employed to increase the interatomic distance of the substrate and therefore create a channel with a strained silicon layer. Thus, the mobility of the carriers in the channel can be significantly improved. This feature combined with the buried gate results in a product with better performance, lower energy consumption and higher reliability.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
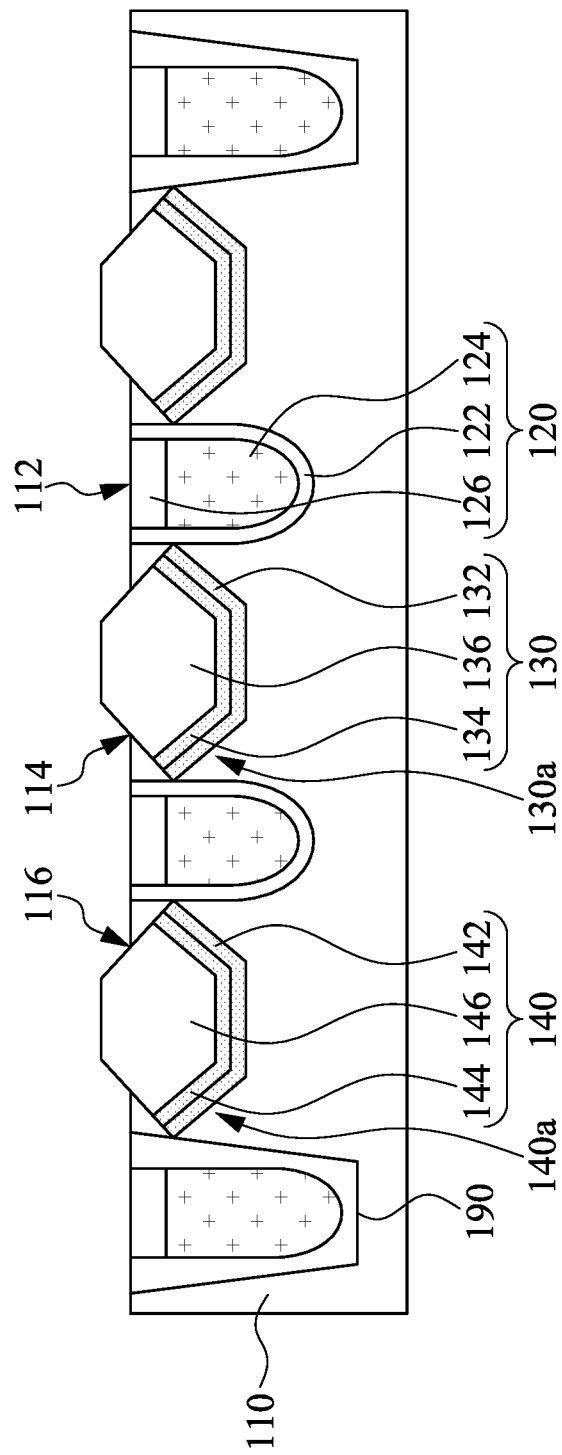
FIG. 1 is a sectional view of a semiconductor memory structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a sectional view of a semiconductor memory structure in accordance with some embodiments of the present disclosure. Please refer to FIG. 1. The semiconductor memory structure 100 provided in the present disclosure includes a substrate 110, a gate structure 120, a drain stressor 130 and a source stressor 140. The gate structure 120 is disposed in the substrate 110. The drain stressor 130 includes a strained part 130a buried in the substrate 110, and the source stressor includes a strained part 140a buried in the substrate 110. In some embodiments, the gate structure 120 is composed of a gate dielectric layer 122, a gate electrode 124, and a gate seal 126. In other embodiments, the entire gate structure 120 is buried in the substrate 110. In other words, the gate seal 126 is covered by the substrate 110, and the gate structure 120 is not exposed by the substrate 110. In other embodiments, the drain stressor 130 includes a first drain layer 132, a second drain layer 134, and a third drain layer 136, and the source stressor 140 includes a first source layer 142, a second source layer 144, and a third source layer 146. In some embodiments, the semiconductor memory structure 100 may further include a plurality of shallow trench isolations 190, which define the active region (not shown).

Figure 2:
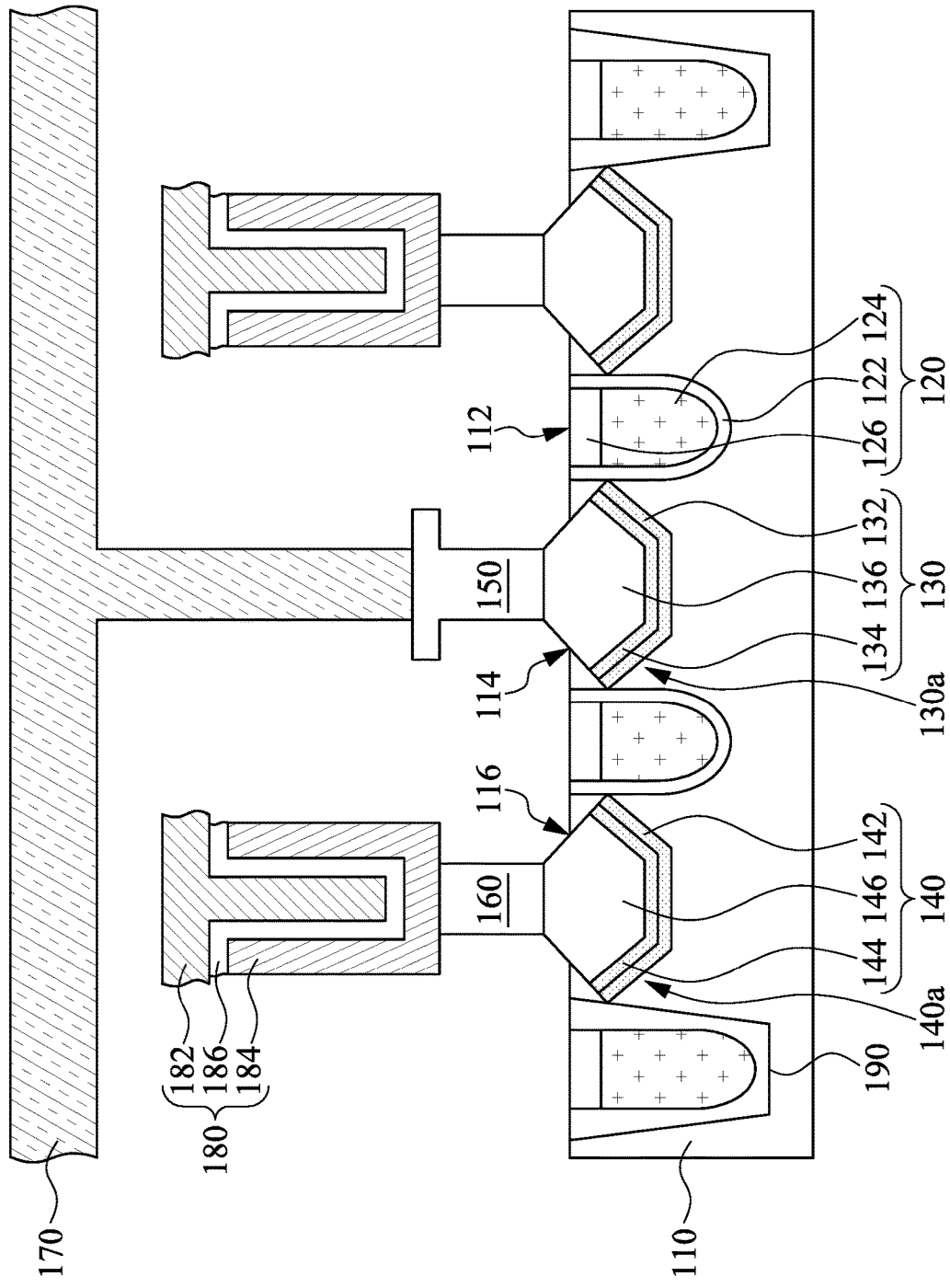
FIG. 2 is a sectional view of a semiconductor memory structure in accordance with some embodiments of the present disclosure.

FIG. 2 is a sectional view of a semiconductor memory structure in accordance with some embodiments of the present disclosure. In some embodiments, the semiconductor memory structure 100a provided by the present disclosure is similar to the semiconductor memory structure 100 disclosed in FIG. 1, but further includes a bit line 170 and a storage capacitor 180, which includes a storage node 184, a cell plate 182 and a dielectric layer 186 between the storage node 184 and the cell plate 182. In some embodiments, the semiconductor memory structure 100a may further include a bit line contact 150 and a storage node contact 160, whereby the bit line 170 is electrically connected to the drain stressor 130 via the bit line contact 150, and the storage node 184 of the storage capacitor 180 is electrically connected to the source stressor 140 via the storage node contact 160. In some embodiments, the gate structure 120 can be connected to a word line (not shown).

In some embodiments, the substrate 110 may be a semiconductor substrate, such as silicon, silicon carbide (SiC), silicon germanium, a III-V compound semiconductor, combinations thereof, or the like. In some embodiments, the material used to form the drain stressor 130 and the source stressor 140 may be silicon, which can be stretched by the SiGe to create a strained silicon layer. In some embodiments, the drain stressor 130 and the source stressor 140 may be hydrogen terminated.

The gate structure 120 is buried in the substrate 110. A buried gate such as the gate structure 120 disclosed in the present disclosure can ensure the length of the channel (not shown) between the drain stressor 130 and the source stressor 140 simply by controlling the depth of the gate trench 112, which can reduce the short channel effect.

Moreover, the drain stressor 130 and the source stressor 140 are formed with materials that can form a strained silicon layer, which has a greater interatomic distance and which can increase the mobility of the carriers and thus improve the performance of the device.

Figure 3:
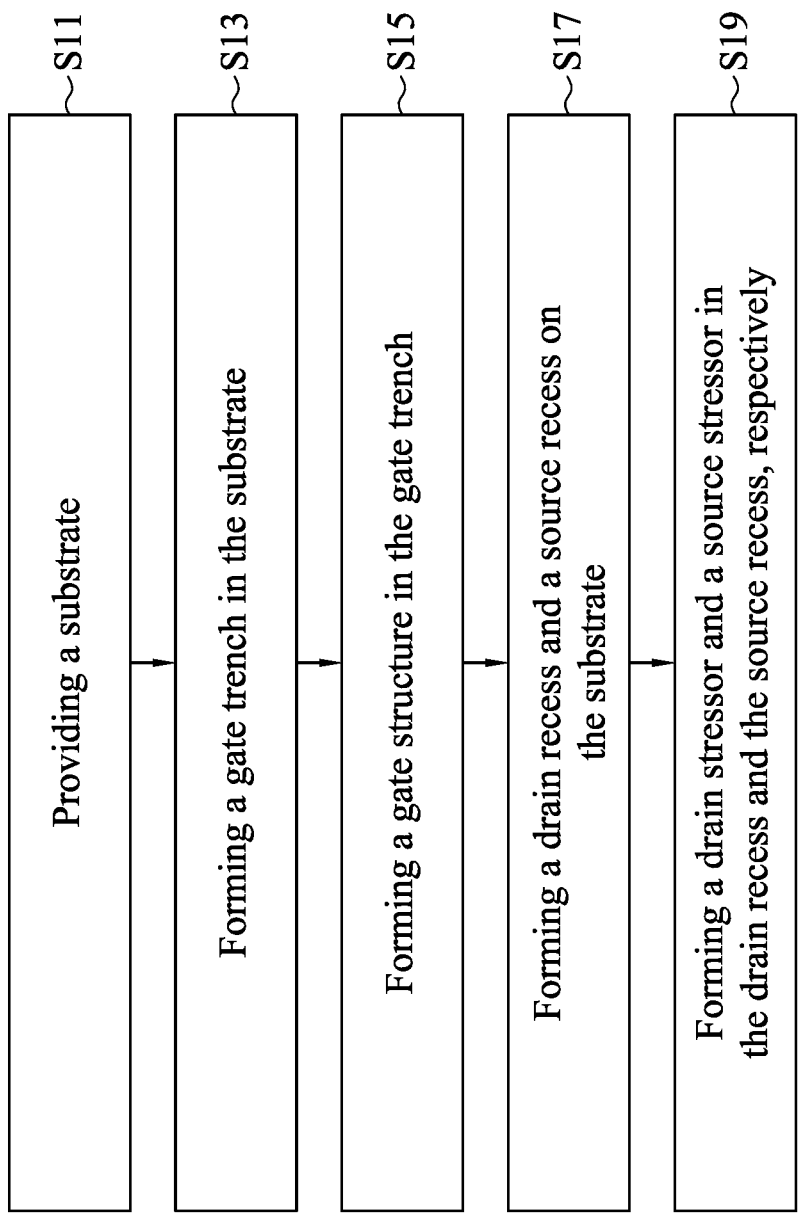
FIG. 3 is a flow diagram of a method of manufacturing a semiconductor memory structure in accordance with some embodiments of the present disclosure.
Figure 4:
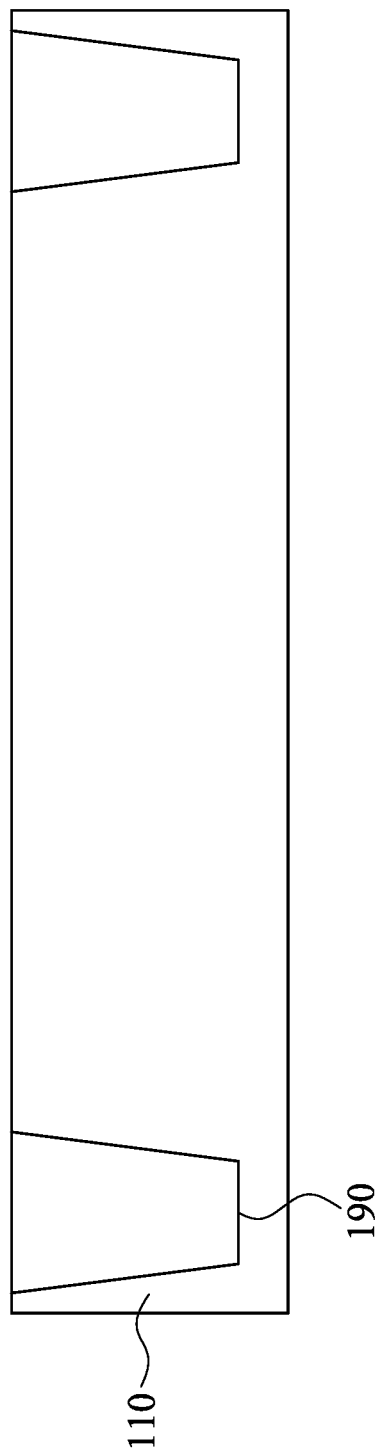
FIG. 4 to FIG. 13 are sectional views of the results of the steps of a method of manufacturing a semiconductor memory structure in accordance with some embodiments of the present disclosure.

The method of manufacturing the semiconductor memory structure 100 will be explained in detail below along with drawings. FIG. 3 is a flow diagram of a method of manufacturing a semiconductor memory structure in accordance with some embodiments of the present disclosure, and FIG. 4 to FIG. 9 are sectional views of the results of steps of the method of manufacturing a semiconductor memory structure in accordance with some embodiments of the present disclosure. Please refer to FIG. 1 and FIGS. 3 to 9. The first step S11 of the method includes providing a substrate 110. In some embodiments, the substrate 110 may be a semiconductor substrate, such as silicon, SiC, SiGe, a III-V compound semiconductor, combinations thereof, or the like. In some embodiments, the substrate 110 may include a shallow trench isolation 190, as shown in FIG. 4. For example, several STI trenches (not shown) may be formed on the substrate 110 and filled to form shallow trench isolations 190. In some embodiments, the STI trenches may be formed by selective etching. Next, to form the shallow trench isolation 190, the step of forming an insulating layer over the substrate 110 and the STI trenches may be performed. In some embodiments, the insulation layer may be formed by a single gap-filling process based on a fluid oxide layer. In some other embodiments, the insulation layer may be configured in the form of a combination (e.g., a stacked form) of the fluid oxide layer and the deposition oxide layer. For example, the fluid oxide layer may include a spin-on dielectric (SOD) and the deposition oxide layer may include a high-density plasma (HDP) oxide layer. The insulation layer is then polished by chemical mechanical polishing (CMP) to remove the insulation layer on the substrate 110. The insulation layer remaining in the STI trenches forms the shallow trench isolation 190 as shown in FIG. 4.

Figure 5:
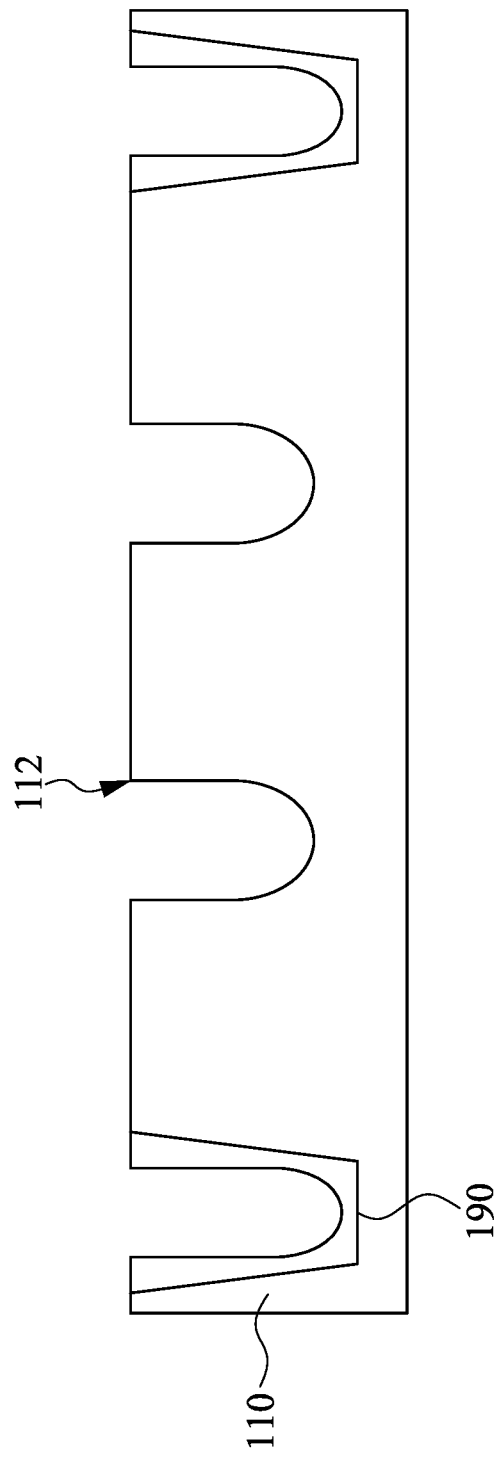

Please refer to FIG. 5. In step S13, a gate trench 112 is formed on the substrate 110. In some embodiments, the substrate 110 is selectively etched to form the gate trench 112. In some embodiments, a hard mask layer (not shown)

is formed on the substrate 110 and a photoresist pattern (not shown) for defining the gate area is formed on the hard mask layer. In such case, the hard mask layer may be configured in a stacked form of an amorphous carbon layer (ACL) and a SiON layer, for example. The hard mask layer is then etched using the photoresist pattern as an etch mask, so that a hard mask pattern (not shown) is formed. Subsequently, the photoresist pattern is removed, and the substrate 110 is etched using the hard mask pattern as an etch mask, such that the gate trench 112 is formed on the substrate 110. In some embodiments, the trench may be formed by etching not only the active region of the substrate but also the shallow trench isolation 190. Generally, a gate is configured in the form of a line, so that the active region and the shallow trench isolation 190 are simultaneously etched and a line-type trench is formed. In such case, the active region and the shallow trench isolation 190 have different etch selectivity ratios, so that the shallow trench isolation 190 is etched more deeply than the active region. That is, the active region is configured in the form of a fin gate, such that it protrudes more than the shallow trench isolation 190 in the gate region.

Figure 6:
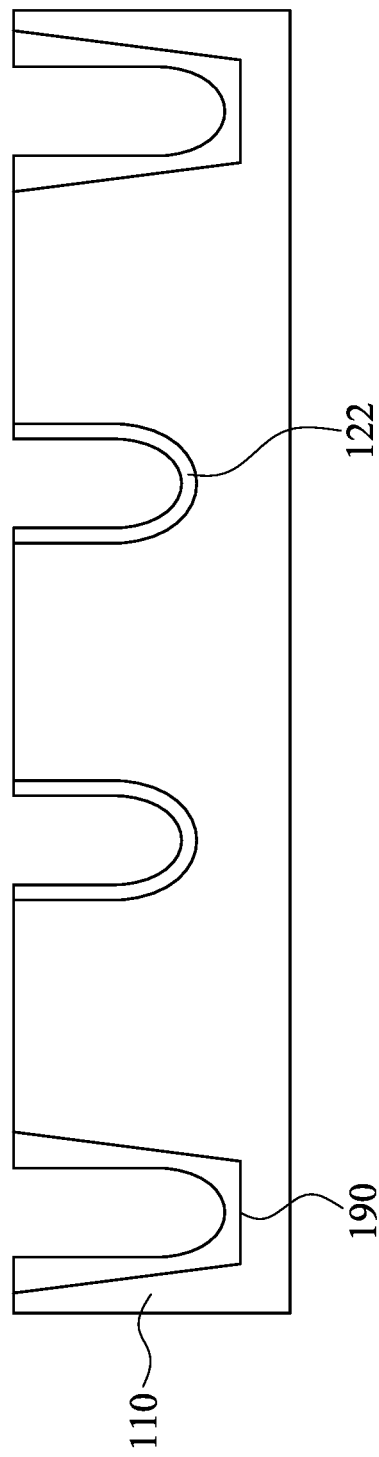
Figure 7:
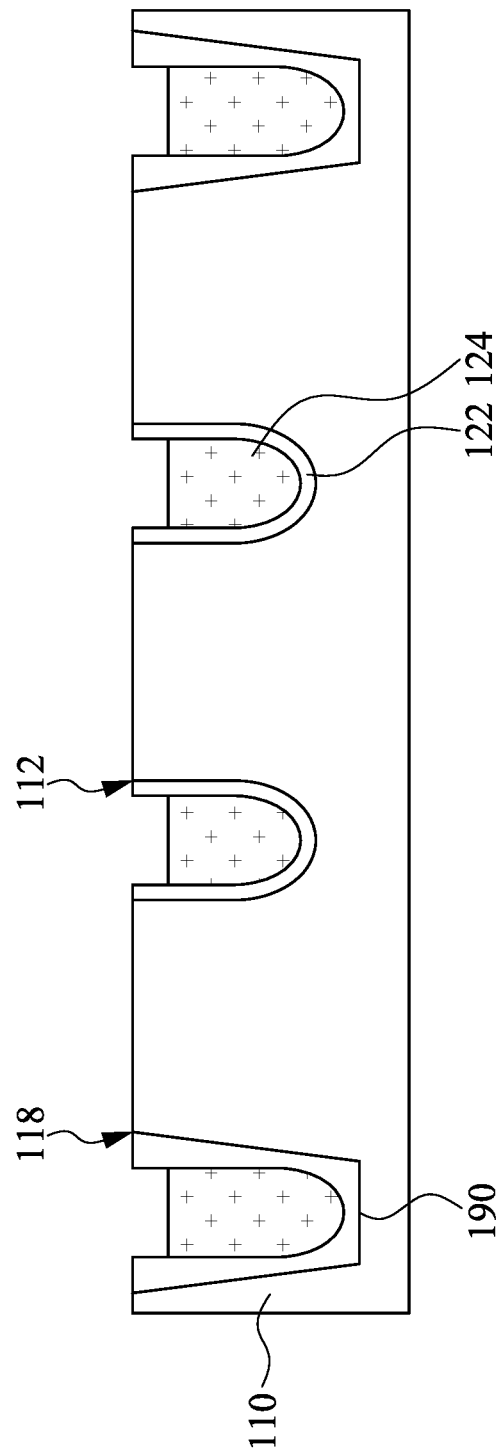

Please refer to FIG. 6. In step S15, the gate structure 120 is formed in the gate trench 112. In some embodiments, the gate structure 120 may include a gate dielectric layer 122, which may be an oxide layer and formed by performing an oxidation process in the gate trench 112 to oxidize the substrate 110 in the gate trench 112, for example. Next, the gate electrode 124 is formed in the gate trench 112, as shown in FIG. 7. In some embodiments, the gate electrode 124 can be formed by depositing a metal layer (not shown) on the substrate 110 and in the gate trench 112, and then processing the metal layer until the metal layer is lower than the surface of the substrate 110 and the remaining metal layer fills only part of the gate trench 112. In such case, the metal layer may, for example, include a titanium nitride (TiN) layer, a tantalum nitride (TaN) layer, a tungsten (W) layer, or the like. In order to reduce resistance of the gate electrode 124, a thin titanium nitride layer (or a tantalum nitride layer) may be conformably deposited, and the tungsten layer may be used for gap filling in such a manner as to form the gate electrode 124 with low resistance.

In some embodiments, the gate electrode 124 may be formed by depositing the titanium nitride layer and the tantalum nitride layer, or may be formed by sequentially depositing the titanium nitride layer, the tantalum nitride layer, and the tungsten layer. The metal layer deposited may then be planarized by CMP or the like. Subsequently, the metal layer is etched back and cleaned in such a manner that the metal layer is buried in only some parts of the trench, so that the gate electrode 124 is formed. In such case, the etch-back process is continuously conducted until the surface of the metal layer in the gate trench 112 becomes lower than the surface of the substrate 110 and the desired height of the gate electrode 124 is obtained.

Figure 8:
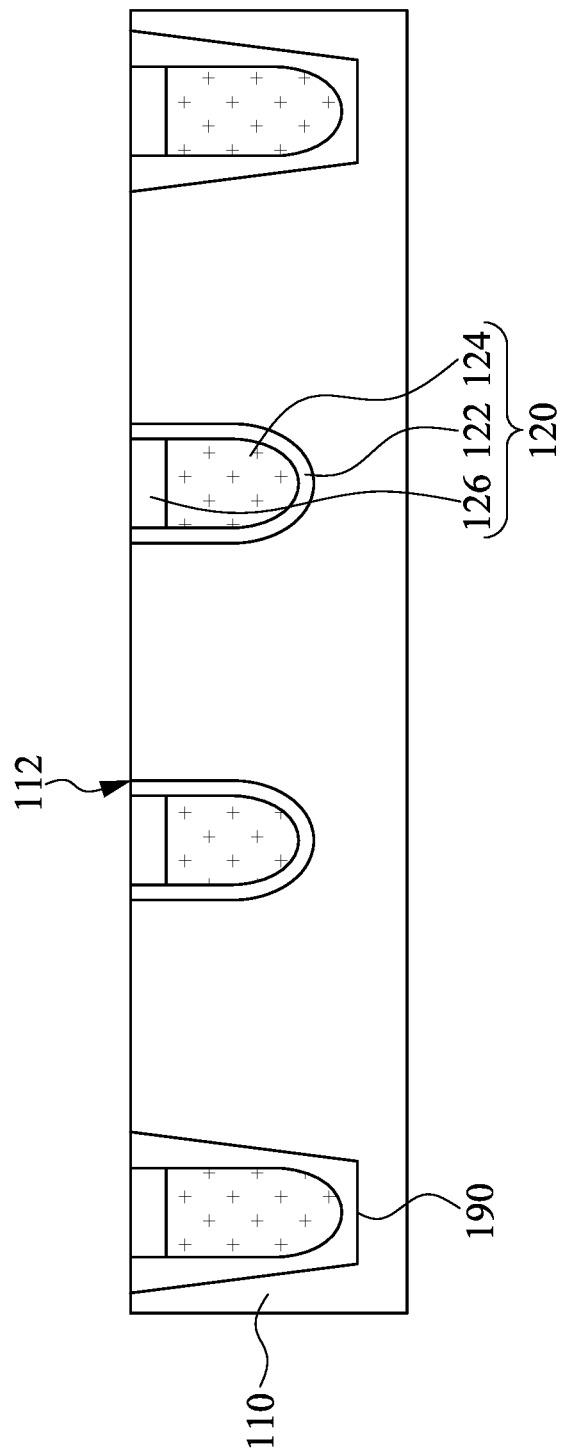

In some embodiments, the gate electrode 124 can then be sealed with a gate seal 126, as shown in FIG. 8. In such case, a sealing layer (not shown), such as a nitride layer, may be formed to seal the upper part of the gate trench 112 and protect the gate electrode 124. In some embodiments, after the sealing layer is sealed in a manner such that the gate trench 112 is completely filled with the nitride layer, the sealing layer is selectively removed by a strip process, so that the sealing layer remains only over the gate electrode 124 and in the gate trench 112.

Figure 9:
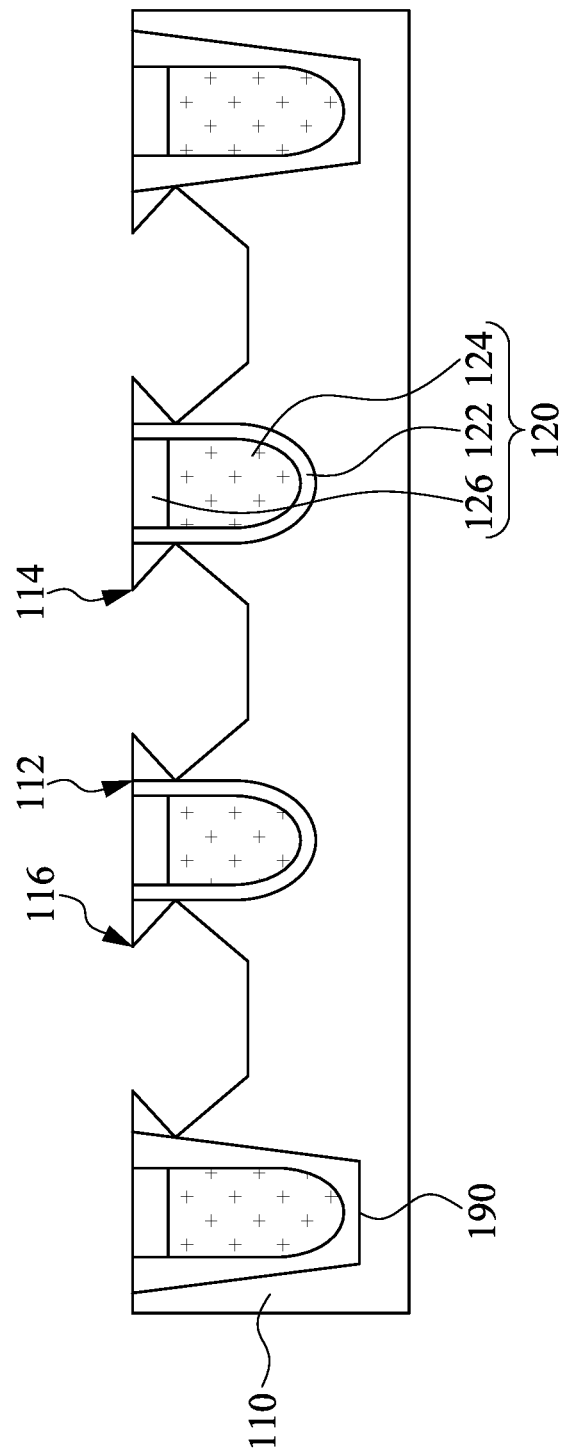
Figure 10:
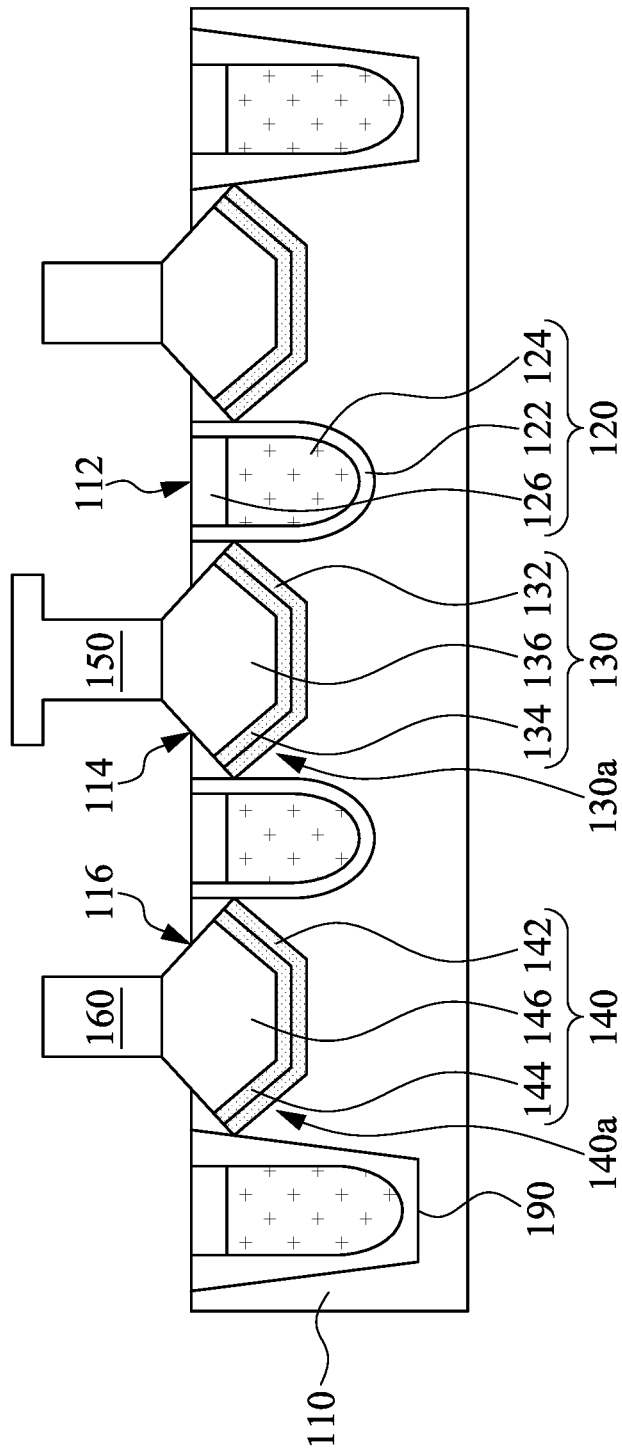
Figure 11:
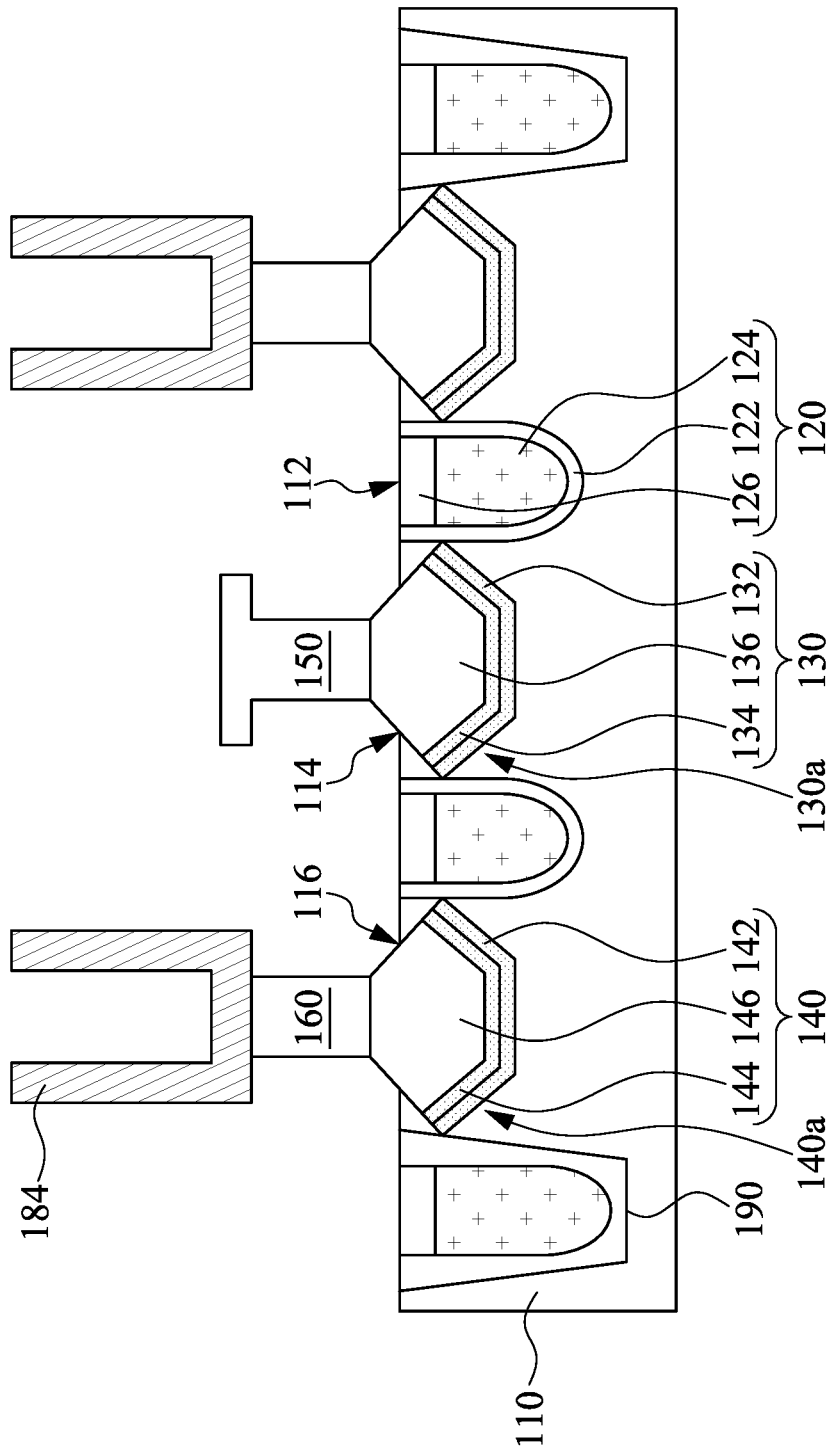

Next, in step S17, the drain recess 114 and the source recess 116 are formed on the substrate 110, as shown in FIG. 9. In some embodiments, a hard mask (not shown) that defines the drain and source areas can be formed by a photolithography process, and the drain recess 114 and the source recess 116 may be formed using, for example, a wet etch process selective to the material of the substrate 110, wherein the wet etch process uses the hard mask to form the drain recess 114 and the source recess 116. For example, an etchant, such as carbon tetrafluoride ($CF_4$), tetramethylammonium hydroxide (THMA), combinations of these, or the like, may be used to perform the wet etch process and to form the drain recess 114 and the source recess 116.

In step S19, the final step, the drain stressor 130 and the source stressor 140 are formed in the drain recess 114 and the source recess 116, respectively. Please refer to FIG. 1. In some embodiments, the drain stressor 130 and the source stressor 140 may be formed by a cyclic deposition and etching (CDE) process. The CDE process includes an epitaxial deposition/partial etch process, which is repeated one or more times. In such case, a first silicon-containing layer (not shown) is epitaxially deposited in the drain recess 114 and the source recess 116. In some embodiments, the resulting metal-oxide-semiconductor (MOS) device is an nMOS device, and the first silicon-containing layer may be made of, for example, silicon, silicon carbide, other semiconductor materials, and/or combinations thereof. The deposition of the first silicon-containing layer may use at least one silicon-containing precursor, such as silane ($SiH_4$), trisilane ($Si_3H_8$), disilane ($Si_2H_6$), dichlorosilane ($SiH_2Cl_2$), other silicon-containing precursors, and/or combinations thereof. In some embodiments, the deposition of the first silicon-containing layer may include in-situ doping of the first silicon-containing layer. When the resulting metal-oxide-semiconductor (MOS) device is an nMOS device, an n-type doping precursor, for example, phosphine ($PH_3$) and/or other n-type doping precursors, may be used.

In some embodiments, the deposition of the first silicon-containing layer may use a carrier gas to introduce the silicon-containing precursor and the n-type doping precursor into the process chamber. The carrier gas may be, for example, nitrogen gas ($N_2$), hydrogen gas ($H_2$), or combinations thereof. In some embodiments, the first silicon-containing layer may be formed by chemical vapor deposition (CVD), for example, atomic-layer CVD (ALCVD), ultra-high vacuum CVD (UHVCVD), low-pressure CVD (LPCVD), reduced-pressure CVD (RPCVD), or other suitable CVDs; molecular beam epitaxy (MBE) process; other suitable epitaxial processes; or combinations thereof. Next, a portion of the first silicon-containing layer in the drain recess 114 and the source recess 116 is removed to form the first drain layer 132 and the first source layer 142. In some embodiments, the removal of the first silicon-containing layer may include use of an etch gas including at least one of hydrogen chloride (HCl), chlorine ($Cl_2$), germanium hydride ($GeH_4$), and other suitable etch gases.

Next, a second silicon-containing layer (not shown) is epitaxially deposited on the remaining first drain layer 132 and the first source layer 142. In some embodiments, the material and the method of forming the second silicon-containing layer are the same as or similar to those of the first silicon-containing layer as described above. In some embodiments, the second silicon-containing layer may have a dopant concentration different from that of the first silicon-containing layer. A portion of the second silicon-containing layer in the drain recess 114 and the source recess 116 is then removed to form the second drain layer 134 and the second source layer 144, which are on the first drain layer 132 and the first source layer 142, respectively. In some embodiments, the removal of the second silicon-containing layer is the same as or similar to the removal of the first silicon-containing layer described above.

Subsequently, a third silicon-containing layer (not shown) is epitaxially deposited to fill the remaining space of the drain recess 114 and the source recess 116 by a selective epitaxial growth (SEG) process. The SEG process is a selective deposition process, and the third silicon-containing layer formed by this process is deposited on the second drain layer 134 and the second source layer 144 to form the third drain layer 136 and the third source layer 146. The third silicon-containing layer deposited by the SEG process may be formed beyond the top surface of the substrate 110, as shown in FIG. 1, in accordance with some embodiments. In alternative embodiments, the top surface of the third silicon-containing layer may be substantially level with the top surface of the substrate 110. In some embodiments, the third silicon-containing layer is doped with phosphorus (P).

In some embodiments, the manufacturing process may continue to form the semiconductor memory structure 100*a* disclosed in FIG. 2. Please refer to FIGS. 10 to 13. In such case, the bit line contact 150 and the storage node contact 160 can be formed on the drain stressor 130 and the source stressor 140, respectively. In some embodiments, forming the bit line contact 150 and the storage node contact 160 may include depositing a conductive layer (not shown), such as a copper layer, on the substrate 110, wherein the conductive layer is in contact with the drain stressor 130 and the source stressor 140. In such case, the conductive layer can then be etched to remove the part of the conductive layer that is not in contact with the drain stressor 130 and the source stressor 140 to form the bit line contact 150 and the storage node contact 160. In some embodiments, a damascene or dual damascene process can be used to form the bit line contact 150 and the storage node contact 160 of more complicated shapes. In some embodiments, the forming of the bit line contact 150 and the storage node contact 160 can be performed in the same step as that in which the conductive layer is formed. In other embodiments, the bit line contact 150 and the storage node contact 160 can be formed separately.

Next, a storage capacitor 180 may be formed in some embodiments to form the semiconductor memory structure 100*a* shown in FIG. 2. In such case, the storage node contact 160 may be formed first by forming an inter-layer dielectric (not shown) on the substrate 110. Next, referring to FIG. 11, a storage node contact hole (not shown) is formed on the inter-layer dielectric, wherein the storage node contact hole exposes the storage node contact 160 on the substrate 110. Next, a conductive layer (not shown) is formed on the inter-layer dielectric and fills the storage node contact hole. Subsequently, the conductive layer is patterned by a photolithography process to form the storage node 184.

Figure 12:
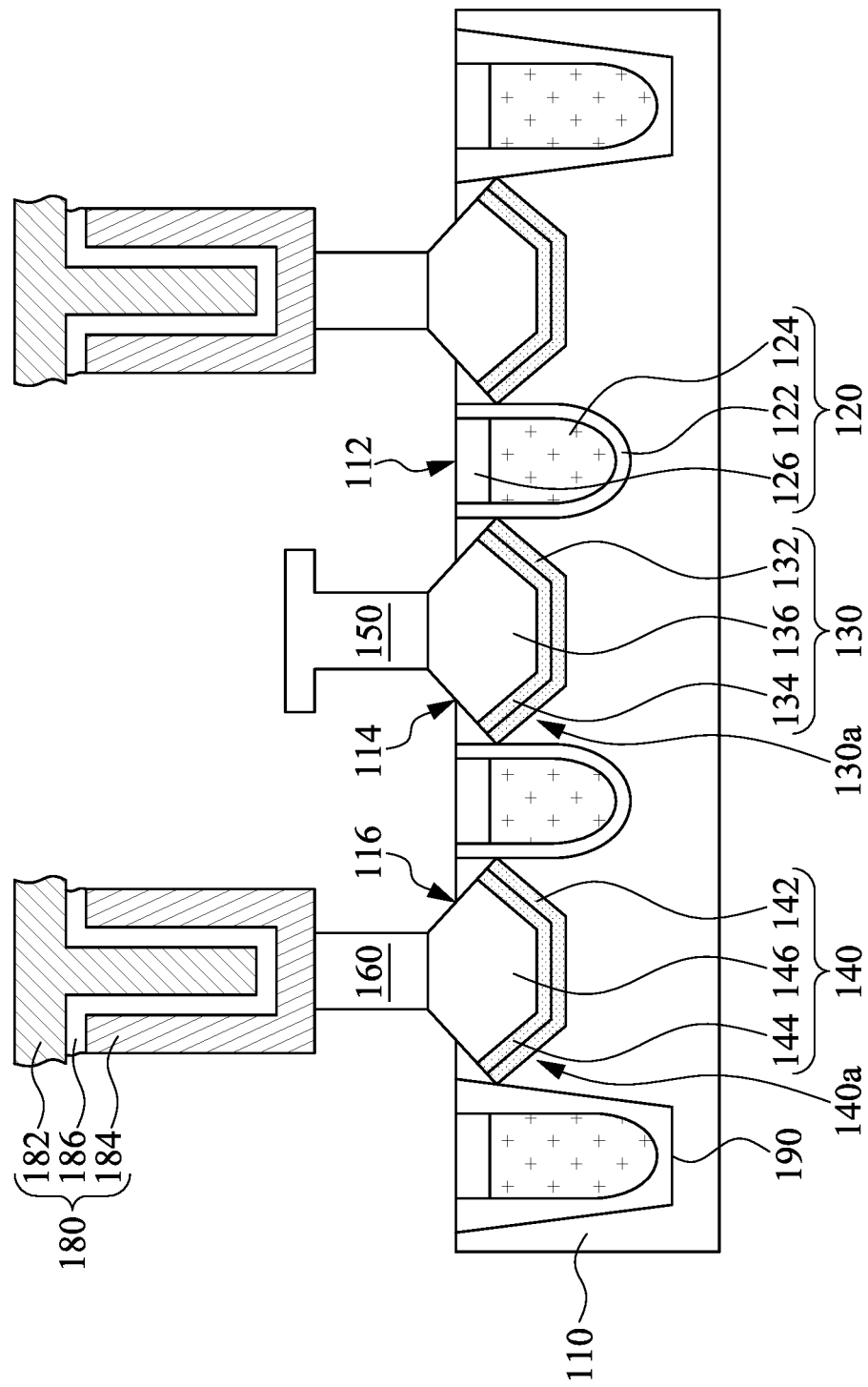

Next, referring to FIG. 12, the dielectric layer 186 can be formed on the storage node 184 using a method such as CVD or oxidation. In some embodiments, the dielectric layer 186 may be a sandwich structure of $SiO_2$—$Si_3N_4$—$SiO_2$. Finally, the cell plate 182 may be formed by forming a polycrystalline silicon layer (not shown) using LPCVD and then performing a photolithography process to define the pattern of the cell plate 182.

Figure 13:
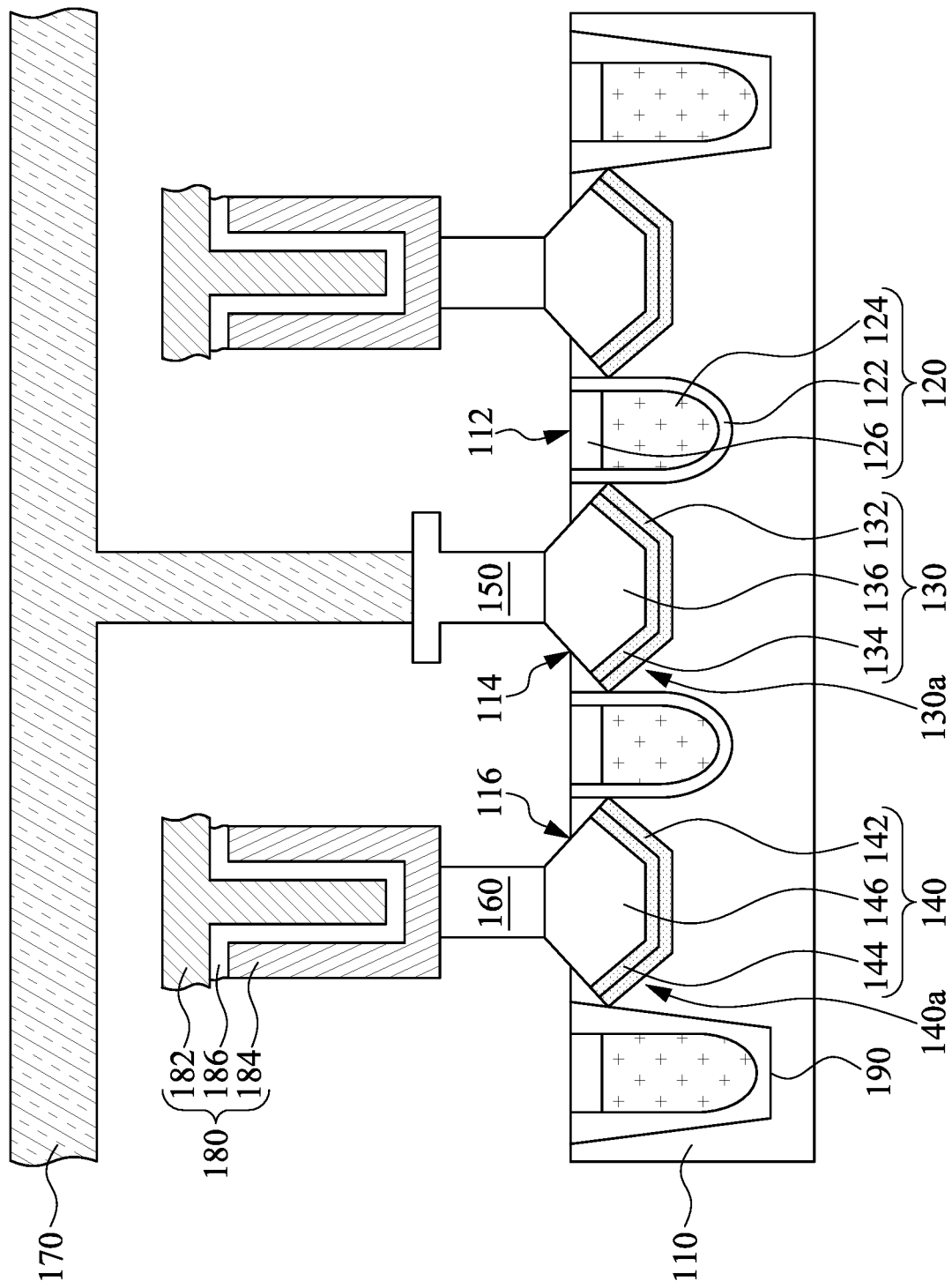

Next, referring to FIG. 13, in some embodiments, a bit line 170 can be formed, wherein the bit line 170 is connected to the bit line contact 150. In some embodiments, the forming of the bit line 170 may include the following steps: forming an inter-layer dielectric (not shown); forming a bit line contact hole (not shown) on the inter-layer dielectric, wherein the bit line contact hole exposes the bit line contact 150 on the substrate 110; forming a conductive layer (not shown) on the inter-layer dielectric and filling the bit line contact hole; and patterning the conductive layer to form the bit line 170.

In summary, the semiconductor memory structures 100, 100*a* provided in the present disclosure include buried gates and drain/source stressors 130, 140. During the manufacturing of a buried gate, the length of the channel can be ensured by determining the depth of the gate trench 112, which can reduce the short channel effect and results in devices with greater reliability.

Moreover, the semiconductor memory structures 100, 100*a* provided in the present disclosure also include a drain stressor 130 and a source stressor 140, which create strained silicon layers having greater interatomic distances, thus reducing atomic force interference of the carriers and resulting in carriers with greater mobility and therefore devices with better performance.

In some embodiments, the shallow trench isolation 190 in semiconductor memory structures 100 and 100*a* may be replaced by another structure. Please refer to FIG. 14 and FIG. 15.

Figure 14:
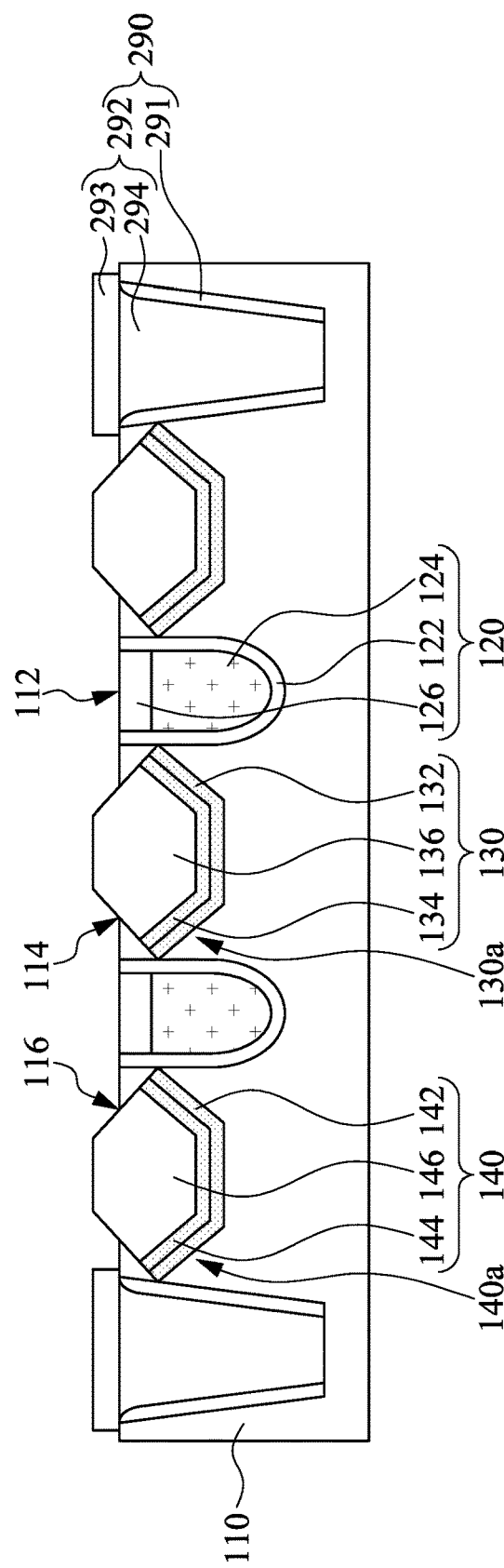
FIG. 14 is a sectional view of a semiconductor memory structure in accordance with some embodiments of the present disclosure.
Figure 15:
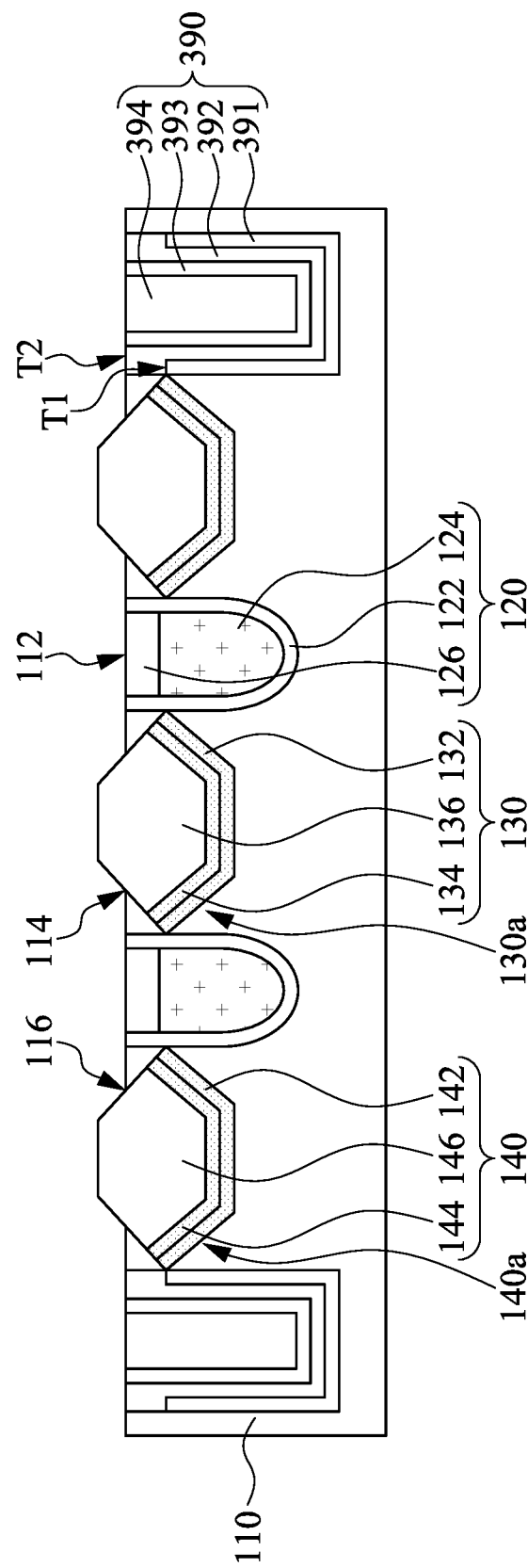
FIG. 15 is a sectional view of a semiconductor memory structure in accordance with some embodiments of the present disclosure.

FIG. 14 is a sectional view of a semiconductor memory structure 200 in accordance with some embodiments of the present disclosure. FIG. 15 is a sectional view of a semiconductor memory structure 300 in accordance with some embodiments of the present disclosure.

The semiconductor memory structure 200 includes a substrate 110, a gate structure 120, a drain stressor 130 and a source stressor 140. The gate structure 120 is disposed in the substrate 110. More specifically, the gate structure 120 is buried in the substrate 110. The drain stressor 130 includes a strained part 130*a* buried in the substrate 110, and the source stressor includes a strained part 140*a* buried in the substrate 110. The gate structure 120 is composed of a gate dielectric layer 122, a gate electrode 124, and a gate seal 126. The drain stressor 130 includes a first drain layer 132, a second drain layer 134, and a third drain layer 136, and the source stressor 140 includes a first source layer 142, a second source layer 144, and a third source layer 146. The substrate 110, the gate structure 120, the drain stressor 130 and the source stressor 140 of the semiconductor memory structure 200 are similar to the substrate 110, the gate structure 120, the drain stressor 130 and the source stressor 140 of the semiconductor memory structure 100, therefore, the details of these elements are omitted herein for brevity.

The semiconductor memory structure 200 further includes a plurality of shallow trench isolations 290, which define the active region (not shown).

As illustrated in FIG. 14, each of the shallow trench isolations 290 includes a plurality of liners 291 and an insulating segment 292. The plurality of liner 291 are to the side surfaces of the substrate 110, and the insulating segment 292 is filled in the space between the liners 291. It should be noted that the bottom end of the insulating segment 292 is in contact with the substrate 110.

The liners 291 have a resistivity greater than a resistivity of the substrate 110. In some embodiments, the liners 291 are formed of titanium, titanium nitride, titanium-tungsten alloy, tantalum, tantalum nitride, or a combination thereof.

The insulating segment 292 includes an extension portion 293 and an embedding portion 294. The embedding portion 294 is disposed in the substrate 110 and between the liners 291. The embedding portion 294 is directly connected to the liners 291.

As illustrated in FIG. 14, an upper portion of the liners 291 has a rounded corner, and the embedding portion 294 covers the rounded corner. More specifically, each of the liner 291 has first side being contact with the substrate 110 and a second side opposite to the first side. The first side is straight, and the second side is substantially straight but bended at the rounded corner. The second side merges with the first side along the rounded corner. Therefore, an upper portion of the embedding portion 294 is extending along the rounded corner toward the first side of the liner 291.

The extension portion 293 is disposed on the embedding portion 294 and the substrate 110. In some embodiments, the extension portion 293 has a uniform width, and the embedding portion 294 has a width varying from the bottom end to the top end of the embedding portion 294. The width of the extension portion 293 is greater than the width of the embedding portion 294. Specifically, the extension portion 293 is disposed to cover a portion of a top surface of the substrate 110.

In some embodiments, the embedding portion 294 and the extension portion 293 are formed of silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, xerogel, aerogel, amorphous fluorinated carbon, organo silicate glass, parylene, bis-benzocyclobutenes, polyimide, porous polymeric material, or a combination thereof, but are not limited thereto. Preferably, the embedding portion 294 and the extension portion 293 are formed of the same material, but are not limited thereto.

In FIG. 14, in each shallow trench isolation 290, the liner 291 proximal to the drain stressor 130 or the source stressor 140 is in contact with the first drain layer 132 or the first source layer 142, however, the present disclosure is not limited thereto. In various embodiments, the liner 291 is separated from the first drain layer 132 and the first source layer 142.

In some embodiments, the liners 291 are formed after the recesses for the shallow trench isolations 290 are provided. An etch process is performed to trim the liners 291 so as to form the shape shown in FIG. 14. Next, the embedding portion 294 is deposited between the liners 291. After the embedding portion 294 is deposited, a planarization process, such as a chemical mechanical polishing, is performed to remove excess material of the embedding portion 294, so as to provide a substantially flat surface on the top of the embedding portion 294 for the subsequent processes. As illustrated in FIG. 14, after the planarization process, the top surface of the embedding portion 294 is leveled with the top surface of the substrate 110. The extension portion 293 is formed over the embedding portion 294 and the substrate 110. In some embodiments, the extension portion 293 originally covers all of the top surface of the instant structure, and a mask layer is formed over the extension portion 293 for patterning the extension portion 293. An etching process is performed according to the mask layer so as to form the extension portion 293 as shown in FIG. 14.

In other embodiments, the semiconductor memory structure 200 may further includes a bit line contact 150, a storage node contact 160, a bit line 170 and a storage capacitor 180 as illustrated in FIG. 2. The storage capacitor includes a storage node 184, a cell plate 182 and a dielectric layer 186 between the storage node 184 and the cell plate 182. The bit line 170 is electrically connected to the drain stressor 130 via the bit line contact 150, and the storage node 184 of the storage capacitor 180 is electrically connected to the source stressor 140 via the storage node contact 160. In some embodiments, the gate structure 120 can be connected to a word line (not shown).

In FIG. 15, the semiconductor memory structure 300 includes a substrate 110, a gate structure 120, a drain stressor 130 and a source stressor 140. The gate structure 120 is disposed in the substrate 110. More specifically, the gate structure 120 is buried in the substrate 110. The drain stressor 130 includes a strained part 130a buried in the substrate 110, and the source stressor includes a strained part 140a buried in the substrate 110. The gate structure 120 is composed of a gate dielectric layer 122, a gate electrode 124, and a gate seal 126. The drain stressor 130 includes a first drain layer 132, a second drain layer 134, and a third drain layer 136, and the source stressor 140 includes a first source layer 142, a second source layer 144, and a third source layer 146. The substrate 110, the gate structure 120, the drain stressor 130 and the source stressor 140 of the semiconductor memory structure 200 are similar to the substrate 110, the gate structure 120, the drain stressor 130 and the source stressor 140 of the semiconductor memory structure 100, therefore, the details of these elements are omitted herein for brevity.

The semiconductor memory structure 300 further includes a plurality of shallow trench isolations 390, which define the active region (not shown).

As illustrated in FIG. 15, each of the shallow trench isolations 390 includes a first liner 391, a second liner 392, a third liner 393 and a filling layer 394. The first liner 391, the second liner 392 and the third liner 393 are sequentially disposed in the recess for forming the shallow trench isolation 390, and the filling layer 394 is deposited to fill the remaining space of the recess.

The first liner 391 is deposited to cover the bottom surface and a portion of side surfaces of the recess. More specifically, the first liner 391 has a topmost surface T1 lower than a top surface of the substrate 110. The second liner 392 is then deposited over the first liner 391, and covered the first liner 391 including the topmost surface T1. The second liner 392 is further covered the remaining side surface of the recess. The second liner 392 has a topmost surface coplanar with the top surface of the substrate 110. The third liner 393 is deposited over the second liner 392. In some embodiments, the third liner 393 has a uniform thickness.

The second liner 392 includes an upper portion and a lower portion. The upper portion is in contact with the substrate 110, the topmost surface of the first liner 391, the lower portion of the second liner 392 and the third liner 393. The lower portion is in contact with the first liner 391, the upper portion of the second liner 392 and the third liner 393. It should be noted that a width of an upper portion of the second liner 392 is greater than a width of a lower portion of second liner 392.

In some embodiments, the topmost surface T1 of the first liner 391 is substantially leveled with a top end of the first drain layer 132 and a top end of the first source layer 142.

Compared to the shallow trench isolations 190 of the semiconductor memory structure 100 and the shallow trench isolations 290 of the semiconductor memory structure 200, the recesses for forming the shallow trench isolations 390 have a rectangular contour in some embodiments. In other words, the side surfaces in the recess are substantially perpendicular to the top surface of the substrate 110.

In some embodiments, the first liner 391 is made of silicon oxide, such as $SiO_2$ and is formed by an oxidation process. For example, a mask layer is formed in an upper portion of the recess, and the oxidation process is a selective oxidation due to different compositions of the material of the mask layer and the substrate 110. The substrate 110 in the recess exposed by the mask layer is oxidized and covered by the first liner 391. After the first liner 391 is formed, the mask layer is removed.

In some embodiments, the second liner 392 is made of nitride, such as such as silicon nitride, and is formed by nitridation process, such as a rapid thermal nitridation (RTN) process.

In some embodiments, the third liner 393 is made of silicon oxynitride, and is formed by an in-situ steam generation (ISSG) process.

In some embodiments, the filling layer 394 is make of a dielectric material, such as silicon oxide, silicon nitride, silicon oxynitride, silicon carbonitride, silicon oxide carbonitride, or a combination thereof. The material of the filling layer 394 is different from the materials of the second liner 392 and the third liner 393. In some embodiments, the filling layer 394 is formed by a deposition process, such as a chemical vapor deposition (CVD) process and an atomic layer deposition (ALD) process.

In some embodiments, a planarization process is performed to remove the excessive portion of the second liner 392, the third liner 393 and/or the filling layer 394, so as to form the shape of the shallow trench isolation 390 shown in FIG. 15.

In other embodiments, the semiconductor memory structure 300 may further includes a bit line contact 150, a storage node contact 160, a bit line 170 and a storage capacitor 180 as illustrated in FIG. 2. The storage capacitor includes a storage node 184, a cell plate 182 and a dielectric layer 186 between the storage node 184 and the cell plate 182. The bit line 170 is electrically connected to the drain stressor 130 via the bit line contact 150, and the storage node 184 of the storage capacitor 180 is electrically connected to the source stressor 140 via the storage node contact 160. In some embodiments, the gate structure 120 can be connected to a word line (not shown).

In one embodiment, the present disclosure provides a semiconductor memory structure, including a substrate, a gate structure, a first shallow trench isolation (STI), and a second STI. The gate structure, the first STI, and a second STI are disposed in the substrate. The gate structure is buried in the substrate. The gate structure is disposed between the first STI and the second STI.

In another embodiment, the present disclosure provides a method of manufacturing a semiconductor memory structure. The method includes: providing a substrate; forming a gate trench in the substrate; forming a gate structure in the gate trench, wherein the gate structure is buried in the substrate; and forming a STI and a second STI in the substrate. The gate structure is disposed between the first STI and the second STI.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor memory structure, comprising:
   a substrate;
   a gate structure disposed in the substrate, wherein the gate structure is buried in the substrate;
   a first shallow trench isolation (STI) disposed in the substrate;
   a second STI disposed in the substrate;
   a drain stressor disposed in the substrate;
   a source stressor disposed in the substrate;
   a bit line connected to the drain stressor; and
   a bit line contact disposed between the drain stressor and the bit line;
   wherein the gate structure is disposed between the first STI and the second STI;
   wherein the drain stressor is disposed between the first STI and the gate structure, and the source stressor is disposed between the gate structure and the second STI;
   wherein the substrate comprises silicon germanium, and the drain stressor and the source stressor comprise silicon; wherein the drain stressor comprises:
   a first drain layer;
   a second drain layer disposed over the first drain layer; and
   a third drain layer disposed over the second drain layer;
   wherein the third drain layer is protruding from the substrate.

2. The semiconductor memory structure of claim 1, wherein the drain stressor has a first strained part, and the source stressor has a second strained part; wherein each of the first STI and the second STI comprises:
   a first liner;
   a second liner, opposite to the first liner; and
   an insulating segment disposed between the first liner and the second liner;
   wherein a bottom end of the insulating segment is in contact with the substrate;
   wherein the insulating segment comprises:
   an embedding portion; and
   an extension portion disposed over the embedding portion;
   wherein a top surface of the embedding portion is coplanar with a top surface of the substrate.

3. The semiconductor memory structure of claim 2, wherein a width of the extension portion is greater than a width of the embedding portion, and the extension portion covers a portion of the top surface of the substrate; wherein a width of a top portion of the embedding portion is greater than a width of a bottom portion of the embedding portion; wherein the embedding portion and the extension portion includes the same material.

4. The semiconductor memory structure of claim 2, wherein each of the first liner and the second liner has a first side and a second side; wherein the first side is in contact with the substrate and is straight, and the second side is bended toward the first side to form a rounded corner.

5. The semiconductor memory structure of claim 1, wherein each of the first STI and the second STI comprises:
a first liner;
a second liner disposed over the first liner;
a third liner disposed over the second liner; and
a filling layer disposed over the third liner;
wherein a topmost surface of the first liner is lower than a top surface of the substrate; wherein the second liner comprises an upper portion and a lower portion; wherein the upper portion of the second liner is in contact with the substrate, the topmost surface of the first liner, the lower portion of the second liner, and the third liner;
wherein a material of the filling layer is different from a material of the second liner and a material of the third liner.

6. The semiconductor memory structure of claim 5, wherein a width of the upper portion of the second liner is greater than a width of the lower portion of the second liner.

7. The semiconductor memory structure of claim 1, further comprising a storage capacitor connected to the source stressor and a storage node contact disposed between the storage capacitor and the source stressor.

8. The semiconductor memory structure of claim 1, wherein the gate structure comprises:
a gate dielectric layer;
a gate electrode disposed over the gate dielectric layer; and
a gate seal, disposed over the gate electrode, wherein the gate seal is in contact with the gate dielectric layer and the gate electrode;
wherein the gate seal is covered by the substrate.

9. A semiconductor memory structure, comprising:
a substrate;
a gate structure disposed in the substrate, wherein the gate structure is buried in the substrate;
a first shallow trench isolation (STI) disposed in the substrate;
a second STI disposed in the substrate;
a drain stressor disposed in the substrate;
a source stressor disposed in the substrate;
a bit line connected to the drain stressor; and
a bit line contact disposed between the drain stressor and the bit line;
wherein the gate structure is disposed between the first STI and the second STI;
wherein the drain stressor is disposed between the first STI and the gate structure, and the source stressor is disposed between the gate structure and the second STI;
wherein the source stressor comprises:
a first source layer;
a second source layer disposed over the first source layer; and
a third source layer disposed over the second source layer;
wherein the third source layer is protruding from the substrate.

* * * * *